(12) United States Patent
Mazzamuto

(10) Patent No.: US 11,664,246 B2
(45) Date of Patent: May 30, 2023

(54) METHOD FOR THERMALLY PROCESSING A SUBSTRATE AND ASSOCIATED SYSTEM

(71) Applicant: Laser Systems & Solutions of Europe, Gennevilliers (FR)

(72) Inventor: Fulvio Mazzamuto, Gennevilliers (FR)

(73) Assignee: LASER SYSTEMS & SOLUTIONS OF EUROPE, Gennevilliers (FR)

( * ) Notice: Subject to any disclaimer, the term of this patent is extended or adjusted under 35 U.S.C. 154(b) by 0 days.

(21) Appl. No.: 16/652,771

(22) PCT Filed: Dec. 3, 2019

(86) PCT No.: PCT/EP2019/083494
§ 371 (c)(1),
(2) Date: Apr. 1, 2020

(87) PCT Pub. No.: WO2020/120228
PCT Pub. Date: Jun. 18, 2020

(65) Prior Publication Data
US 2021/0225670 A1 Jul. 22, 2021

(30) Foreign Application Priority Data
Dec. 13, 2018 (EP) .................................... 18306688

(51) Int. Cl.
*H01L 21/67* (2006.01)
*H01L 21/04* (2006.01)
*H01L 21/225* (2006.01)

(52) U.S. Cl.
CPC ...... *H01L 21/67115* (2013.01); *H01L 21/041* (2013.01); *H01L 21/0455* (2013.01); *H01L 21/2253* (2013.01); *H01L 21/2258* (2013.01)

(58) Field of Classification Search
None
See application file for complete search history.

(56) References Cited

U.S. PATENT DOCUMENTS

| 2003/0183612 A1 | 10/2003 | Timans et al. |
| 2013/0029499 A1 | 1/2013 | Hunter |

(Continued)

OTHER PUBLICATIONS

International Search Report and Written Opinion, dated Jan. 10, 2020, from corresponding PCT application No. PCT/EP2019083494.

(Continued)

*Primary Examiner* — Alexander G Ghyka
(74) *Attorney, Agent, or Firm* — Nixon & Vanderhye

(57) ABSTRACT

A method for thermally processing a substrate having a surface region and a buried region with a pulsed light beam, the substrate presenting an initial temperature-depth profile and the surface region presenting an initial surface temperature, including steps of: illuminating the surface region with a preliminary pulse so that it generates an amount of heat and reaches a predetermined preliminary surface temperature; and illuminating the surface region with a subsequent pulse after a time interval so that it reaches a predetermined subsequent surface temperature. The time interval is determined such that the surface region reaches a predetermined intermediate surface temperature greater than the initial surface temperature, such that during the time interval, the amount of heat is diffused within the substrate down to a predetermined depth so that the substrate presents a predetermined intermediate temperature-depth profile.

24 Claims, 5 Drawing Sheets

(56) References Cited

U.S. PATENT DOCUMENTS

2014/0057457 A1* 2/2014 Wang ................ H01L 27/14634
           438/778
2015/0170918 A1* 6/2015 Wakabayashi ........ H01L 21/268
           438/530
2016/0151859 A1* 6/2016 Sparks ................ B23K 26/034
           219/76.12

OTHER PUBLICATIONS

Kudo et al. "PN Junction Formation for High-Performance Insulated Gate Bipolar Transistors (IGBT); Double-Pulsed Green Laser Annealing Technique", MRS Online Proceedings Library, Jan. 1, 2006, vol. 912, XP055260403.

* cited by examiner

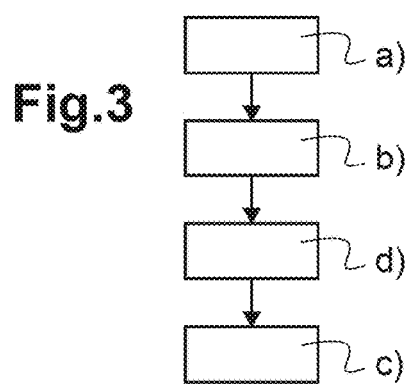
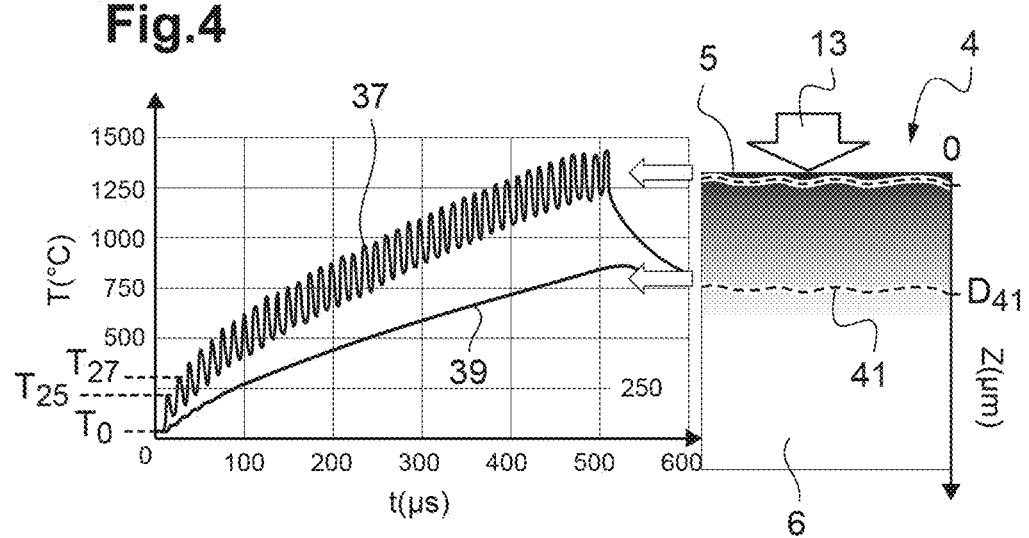
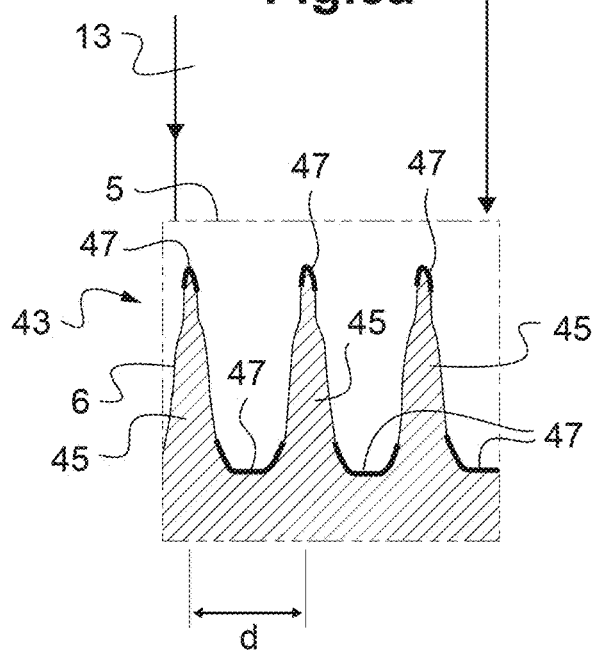
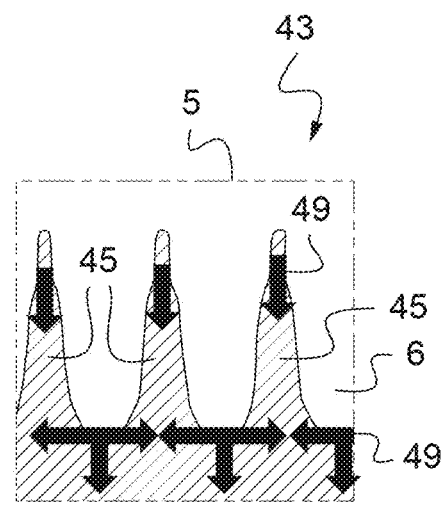

METHOD FOR THERMALLY PROCESSING A SUBSTRATE AND ASSOCIATED SYSTEM

TECHNICAL FIELD OF THE INVENTION

The invention relates to the thermal processing of semiconductor materials.

More precisely the invention relates to a method for thermally processing a substrate with a pulsed light beam.

The invention also relates to a system for thermally processing a substrate with a pulsed light beam.

BACKGROUND INFORMATION AND PRIOR ART

In semiconductor manufacturing processes, devices formed on the surface of a substrate and devices buried under the surface can be very fragile and sensitive to temperature dynamics.

In order not to damage the devices during the thermal processing phase of the manufacturing process, it is critical to achieve perfect control of the variation of temperature of the substrate.

Modern thermal processing technology such as laser annealing can have a very short time at melt temperature, i.e. on a sub-microsecond timescale, and can have a very shallow heat penetration into the substrate. Nevertheless, even if the heat source is confined and time controlled, the annealing dynamics is always difficult to control.

Particularly in nanosecond laser technology, where a surface region of the substrate is submitted to nanosecond laser pulses, annealing dynamics during a pulse is a competitive phenomenon between the thermal excitation of the surface region and the relaxation by thermal diffusion into the buried region of the substrate.

For instance, when a material having a high thermal conductivity is submitted to a nanosecond laser annealing, thermal diffusion can be important during the pulse. The temperature ramp up of the surface temperature will be slow and annealing will penetrate deep into the buried region of the substrate.

In the opposite situation, when a thermal insulator material is exposed to a nanosecond laser, thermal diffusion during the pulse can be neglected, thus obtaining a localized in-depth heating and a very fast rise in surface temperature.

Furthermore, often the surface region has to be annealed at a given temperature, whereas regions buried in the substrate have to be annealed at another given temperature, or should not be annealed.

In laser treatment, temperature evolution and heat diffusion is so traditionally difficult to control due to the indirect results of interdependent laser parameters and material/device thermal properties. Control is even more difficult in sub-microsecond system such as nanosecond pulsed laser where the pulse duration and the repetition rate are generally fixed, or not flexible, and limited by the laser source.

A method for improving the temperature control during thermal processing is desired.

SUMMARY OF THE INVENTION

In this context, the invention provides a method for thermally processing a substrate with a pulsed light beam, the substrate having a surface region and a buried region, a substrate temperature of the substrate presenting an initial temperature-depth profile and a surface temperature of the surface region being at an initial surface temperature, comprising steps of:

b) illuminating the surface region with a preliminary pulse of the pulsed light beam, the preliminary pulse thereby providing a preliminary amount of energy to the surface region, so that the surface region generates a preliminary amount of heat and the surface temperature reaches a predetermined preliminary surface temperature, c) illuminating the surface region of the substrate with a subsequent pulse of the pulsed light beam after a time interval, the subsequent pulse thereby providing a subsequent amount of energy to the surface region so that the surface region generates a subsequent amount of heat and the surface temperature reaches a predetermined subsequent surface temperature.

According to the method, the time interval is determined such that during the time interval the surface temperature reaches a predetermined intermediate surface temperature, said predetermined intermediate surface temperature being greater than the initial surface temperature, such that during the time interval the preliminary amount of heat is diffused in the buried region down to a predetermined depth of the substrate so that the substrate temperature presents a predetermined intermediate temperature-depth profile.

The method allows precise control of the variation in surface temperature of the surface region and of the temperature-depth profile of the substrate, ie of the temperature dynamics of the substrate.

The method allows the surface temperature to gradually increase over time thanks to the cumulative effect of the pulses. Indeed, the time interval is such that the surface temperature does not have enough time to go back to the initial temperature between two pulses. Hence, the subsequent heat generated by the surface region is added to the heat that has not yet diffused into the buried region, and the surface temperature after the subsequent pulse is higher than the surface temperature after the preliminary pulse.

This is advantageous as the temperature ramp of the surface region, ie the rate of change in temperature over time, can be adjusted depending on the substrate material and the devices formed in and on the substrate. For example, sensitive devices and substrate can be submitted to a gentle temperature ramp, whereas more rugged devices and substrate can be submitted to a steeper temperature ramp.

This method also allows controlling the variation in temperature profile of the buried region. For pulses providing less energy, the amount of heat diffusing into the buried region is lower and the buried region will reach lower temperatures than for pulses providing more energy. Still, thanks to the cumulative effect it is possible to reach the target surface temperature.

This is advantageous as the method can thus be adapted to process thermal conductors and thermal insulators.

This method also allows to submit the substrate to a target temperature-depth profile that is adapted to the thermal processing of specific electronic structures such as FINFET or IGBT.

Another advantageous and non-limiting feature of the method according to the invention includes: the step b) of illuminating the surface region with the preliminary pulse and the step c) of illuminating the surface region with the subsequent pulse are repeated until the surface temperature reaches a target temperature and the substrate temperature presents a target temperature-depth profile.

Another advantageous and non-limiting feature of the method according to the invention includes: the buried region of the substrate comprises a region implanted with dopant elements having a predetermined dopant elements concentration-depth profile, and wherein the target temperature-depth profile is adapted to activate the dopant elements of the implanted region.

Other advantageous and non-limiting features of the method according to the invention includes:
- the implanted region is situated at a depth greater than 500 nanometers from the surface region and has a thickness less than 50 micrometers,
- the dopant elements are adapted to generate one type of unipolar carriers in the implanted region,
- the dopant elements are adapted to generate two types of unipolar carriers in the implanted region,
- the substrate is a semiconductor material selected from a group comprising: Silicon, Silicon Carbide, Silicon Germanium, Germanium, Gallium Nitride, Gallium Arsenide, Diamond.

Another advantageous and non-limiting feature of the method according to the invention includes: each of the preliminary pulse and subsequent pulse has a duration equal to or less than 1 nanosecond. This is advantageous as pulses of less than 1 nanosecond will generate a rapid temperature increase with no significant diffusion during the pulse, hence allowing a precise control of the surface peak temperature.

Another advantageous and non-limiting feature of the method according to the invention includes: the pulsed light beam has a wavelength equal to or less than 532 nanometers. This is advantageous as light having a wavelength equal to or less than 532 nanometers is better absorbed by the substrate than light having a longer wavelength than 532 nm. Hence, the energy provided by the pulse is confined in a shallow region of the substrate, and the Other advantageous and non-limiting features of the method according to the invention include:
- the time interval between the preliminary pulse and the subsequent pulse is equal to or less than 25 nanoseconds,
- the pulsed light beam has a wavelength equal to or less than 532 nanometers,
- the energy density of the pulsed light beam is greater than 1 millijoule per centimeter squared per pulse,
- the method further comprises a step a) of determining a value of a parameter relative to the pulsed light beam in order to reach the predetermined preliminary surface temperature, the predetermined intermediate surface temperature and the predetermined subsequent temperature-depth profile, wherein the parameter relative to the pulsed light beam is selected from a group comprising: the time interval, an energy density of pulsed light beam, a shape of a light spot formed by the pulsed light beam on the surface region,
- the method further comprises a step d) of scanning the pulsed light beam over the surface region and wherein during step a) the group of parameter relative to the pulsed light beam further comprises a scan speed of the pulsed light beam,
- the preliminary amount of energy delivered by the preliminary pulse is different from the subsequent amount of energy delivered by the subsequent pulse,
- the amount of energy delivered by each of the preliminary pulse and subsequent pulse is less than an amount of energy necessary for the surface region to reach a melt temperature of the surface region of the substrate,
- the target temperature is the melt temperature of the surface region.

The invention also relates to a system for thermally processing a substrate with a pulsed light beam, the substrate having a surface region and a buried region, a substrate temperature of the substrate presenting an initial temperature-depth profile and a surface temperature of the surface region being at an initial surface temperature, said system comprising:
- a light source adapted to emit a light beam,
- a beam control system configured to generate the pulsed light beam from the emitted light beam, said system being adapted to generate a preliminary pulse and a subsequent pulse,
  - said preliminary pulse of the pulsed light beam illuminating the surface region of the substrate, the preliminary pulse thereby providing a preliminary amount of energy to said surface region, so that the surface region generates a preliminary amount of heat and the surface temperature reaches a predetermined preliminary surface temperature,
  - said subsequent pulse of the pulsed light beam illuminating the surface region of the substrate after a time interval, the subsequent pulse thereby providing a subsequent amount of energy to said surface region, so that said surface region generates a subsequent amount of heat and the surface temperature reaches a predetermined subsequent surface temperature.

According to the invention, the system is adapted to generate said subsequent pulse after said time interval, said time interval being determined such that during the time interval the surface temperature reaches a predetermined intermediate surface temperature, said predetermined intermediate surface temperature being greater than the initial surface temperature, such that during the time interval the preliminary amount of heat is diffused within the buried region down to a predetermined depth of the substrate so that the substrate temperature presents a predetermined intermediate temperature-depth profile.

Other advantageous and non-limiting features of the method according to the invention include:
- the system is configured to repeat the illumination of the surface region with the preliminary pulse and the illumination of the surface region with the subsequent pulse until the surface temperature reaches a target temperature and the substrate temperature presents a target temperature-depth profile,
- the buried region of the substrate comprises a region implanted with dopant elements having a predetermined dopant element concentration-depth profile, and wherein the target temperature-depth profile is adapted to activate the dopant elements of the implanted region,
- each of the preliminary pulse and subsequent pulse has a duration equal to or less than 1 nanosecond,
- the pulsed light beam has a wavelength equal to or less than 532 nanometers,
- the time interval between the preliminary pulse and the subsequent pulse is equal to or less than 25 nanoseconds,
- the energy density of the pulsed light beam is greater than 1 millijoule per centimeter squared,
- the beam control system is configured to determine a value of a parameter relative to the pulsed light beam in order to reach the predetermined preliminary surface temperature, the predetermined intermediate surface temperature and the predetermined subsequent temperature-depth profile, wherein the parameter relative to the pulsed light beam is selected from a group comprising: the time interval, an energy density of pulsed light beam, a shape of a light spot formed by the pulsed light beam on the surface region.

DETAILED DESCRIPTION OF EXAMPLE(S)

This description is given for non limiting illustrative purposes only and will be better understood when referring to the annexed drawings wherein:

FIG. 1 is a schematic representation of a system for thermally processing a region of a substrate according to the invention, FIG. 2 is a graph of the variation of a surface temperature in function of time of a surface region of the substrate submitted to the thermal processing according to the invention, FIG. 3 is a schematic representation of the steps of the method for thermally processing a region of a substrate according to the invention, FIG. 4 is a graph of the variation temperature in function of time at different depths of the substrate submitted to the thermal processing according to the invention, FIGS. 5a and 5b are schematic representations of a semiconductor structure submitted to the thermal processing according to the invention, FIG. 6 is a graph of the variation temperature in function of time at different depths of the semiconductor structure of FIGS. 5a and 5b submitted to the thermal processing according to the invention, FIG. 7 is a graph of a plurality of surface temperature dynamics obtained by submitting a substrate to a plurality of pulse trains having different energy and frequency, FIGS. 8a to 8c illustrate temperature curves that exhibit standard surface temperature ramp up and corresponding pulse trains, FIG. 9 is a graph of the variation of temperature in function of the depth of the substrate submitted to different combination of parameters relative to a pulsed beam, and of a dopant implantation profile of the substrate implanted with a single specie of dopant elements, FIG. 10 is a graph of the variation of temperature in function of the depth of the substrate submitted to different combination of parameter relative to a pulsed beam and of dopant implantation profiles of the substrate implanted with two species of dopant elements.

FIG. 1 represents a system 1 for thermally processing a substrate 4.

Substrate 4 is made of a semiconductor material. Substrate 4 comprises for example a Si (Silicon) material or a SiGe (Silicon-Germanium) material.

Electronic devices such as transistors, resistor and their metallic interconnects are formed on a surface region 5 of substrate 4.

Surface region 5 has a surface melt temperature Tm. Surface melt temperature Tm depends on the substrate material and on the electronic devices formed on surface region 5.

Under surface region 5, substrate 4 presents a buried region 6. Buried region 6 may also comprise buried layers 41 of electronic devices. Each buried layer 41 has a depth DI that is measured along a first axis (0z). First axis (0z) is perpendicular to surface region 5, first axis (0z) has an origin 0 is situated on surface region 5. First axis (0z) is oriented towards the bulk of semiconductor material 3. Each buried layer 41 has a respective melt temperature Tblm.

Buried region 6 presents a temperature-depth profile 8. Temperature-depth profile 8 corresponds to the variation of temperature as a function of the depth of buried region 6.

System 1 comprises a light source 7, and a beam control system 9.

Light source 7 emits a light beam 11, for example a laser beam 11. Light source 7 is, for example a short wavelength laser with an emitting wavelength equal to or less than 1.06 micrometers. Light source 7 is, preferably, a laser with an emitting wavelength equal to or less than 532 nanometers. Light source 7 is, preferably, an ultraviolet laser with an emitting wavelength equal to or less than 355 nanometers.

Light source 7 is preferably a pulsed laser, preferably a quasi continuous wave laser operating at a very high repetition rate, for example greater than 40 megahertz.

Beam control system 9 receives and modifies emitted light beam 11 to produce a pulsed light beam 13 adapted to thermally process substrate 4.

Beam control system 9 controls the variation of the surface temperature of surface region 5 and the variation of temperature-depth profile of buried region 6 by controlling parameters relative to pulsed light beam 13. The parameters relative to pulsed light beam 13 include: an energy density Ed of the pulsed light beam, a duration of a pulse $t_p$, a pulse frequency, a time interval $\Delta t$ between pulses equal to the inverse of the pulse frequency, a total exposition time to the pulsed light beam, a number of pulses during the thermal processing.

To this end, beam control system 9 comprises components such as a cavity, lenses, attenuators 15, mirrors 17, a beam shaper 19, a beam scanner 21 and a control unit 23.

For example, beam control system 9 controls the pulse energy density Ed by passing emitted light beam 11 through attenuator 15, comprising for example an attenuation plate, and by changing the transmission of the attenuator. Alternatively, or in addition, beam control system 9 controls the pulse energy Ed density by changing an internal parameter of light source 7, such as a pumping power of light source 7.

For example, beam control system 9 controls the frequency of pulsed light beam 13 with adapted components. For example, the frequency of pulsed light beam 13 can be adjusted by externally controlling an oscillator of light source 7 at the desired frequency. Alternatively, the frequency of pulsed light beam 13 can be controlled by using an electro-optic module, for example a "pulse picker" that deflects specific pulses in a pulse train.

For example, beam control system 9 controls the shape and the size of a light spot 20 formed on surface region 5 by pulsed light beam 13 thanks to beam shaper 19.

For example, beam control system 9 controls the number of pulses received by surface region 5 during the thermal processing thanks to beam scanner 21. The scan speed is determined so as to illuminate surface region 5 with the desired number of pulses. The pulses accumulated at any illuminated point on surface region 5 is equal to the light spot size multiplied by the frequency of the pulsed light beam 13 divided by the scan speed.

Beam control system 9 comprises a control unit 23. Control unit 23 comprises, for example, a microprocessor and a memory. The memory of control unit 23 stores a computer program adapted to implement the method for thermally processing substrate 4 when executed by the microprocessor. Furthermore, control unit 23 is configured to send instructions to the other components 15, 17, 19, 21 of beam control system 9 and to light source 7 in order to control the parameter relative to pulsed light beam 13.

FIG. 2 illustrates some of the parameters of pulsed light beam 13. Pulsed light beam 13 comprises a pulse train 24. Here pulse train 24 comprises six pulses 25, 27 also called six cycles.

The duration $t_p$ of a single pulse 25, 27 of pulsed light beam 13 is, for example, equal to or less than 100 nanoseconds. The duration $t_p$ of single pulse 25, 27 is preferably equal to or less than 10 nanoseconds. The duration $t_p$ of single pulse 25, 27 is preferably equal to or less than 1 nanosecond.

The energy density $E_d$ of single pulse 25, 27 is comprised between 1 microjoule per centimeter squared and 30 millijoules per centimeter squared.

In FIG. 2, it is visible that pulsed laser beam 13 has two energy states: "on state" where the energy delivered by a pulse 25, 27 is different from zero, and "off state" where the energy delivered by a pulse 25, 27 is equal to zero.

The duration of time interval Δt between a preliminary pulse 25 and a subsequent pulse 27 is equal to or less than 1 millisecond. The duration of time interval Δt between preliminary pulse 25 and subsequent pulse 27 is preferably equal to or less than 1 microsecond. The duration of time interval Δt between preliminary pulse 25 and subsequent pulse 27 is preferably equal to or less than 1 nanosecond. In other words, the frequency of pulsed light beam 13 ranges from 10 megahertz to 1 gigahertz.

The total exposition time of surface region 5, including a total time between pulses, is equal to or less than 1 millisecond. The total exposition time of surface region 5 is preferably equal to or less than 10 microseconds.

By controlling the time interval Δt, the pulsed light beam energy density Ed, the pulsed light beam frequency, the scan speed and the beam shape, system 1 achieves complete control of the processing conditions.

In FIG. 2, first curve 29 represents the variation of a surface temperature Ts of surface region 5 over time. It visible in FIG. 2 that surface temperature Ts has a cyclical behavior. Here a temperature cycle is accomplished when surface temperature has cycled from one temperature extreme to the consecutive same temperature extreme, for example between two consecutive minima or two consecutive maxima.

When surface region 5 is illuminated by a preliminary pulse 25, surface temperature Ts reaches a predetermined preliminary surface temperature $T_{25}$. When surface region 5 is not illuminated, surface temperature reaches a predetermined intermediate surface temperature $T_i$.

Here, surface temperature Ts decreases when surface region 5 is not illuminated, hence predetermined preliminary surface temperature $T_{25}$ is a temperature maximum.

Since in this example, surface region 5 is illuminated by a pulse train 24 of six pulses, first curve 29 exhibits 6 temperature cycles.

During subsequent pulse 27, surface temperature Ts reaches a predetermined subsequent surface temperature $T_{27}$.

FIG. 2 also illustrates an envelope of surface temperatures having an upper envelope part 31 that passes by the temperature maxima reached after a pulse, and a lower envelope part 33 that passes by the temperature minima reached after a pulse.

FIG. 2 also illustrate a temperature ramp 35, in other words a rate of change in temperature over time. The temperature ramp 35 is determined based on the parameters relative to pulsed light beam 13.

In an example, light source 7 comprises a quasi continuous wave laser (QCW), such as the Paladin laser model from Coherent.

The Paladin laser has an emitting wavelength of 355 nm.
The pulse duration $t_p$ of a single pulse is 15 picoseconds.
The Paladin laser has a fixed pulse frequency equal to 80 MHz, in other words, the duration of time interval Δt between pulses is 12.5 nanoseconds.

The Paladin laser has a power of 16 W. The energy per pulse of the emitted beam is 0.2 microjoules.

Beam control system 9 shapes pulsed light beam 13 into an about 30 micrometer Gaussian light spot in order to reach an energy density $E_d$ of 28 microjoules per centimeter squared.

The scan speed is, for example, 1 meter per second. For a light spot size of 30 micrometers at a frequency of 80 MHz, the processing time is 30 microsecond which corresponds to 2400 pulses.

In other examples, light source 7 comprises another Quasi Continuous Wave laser having tunable frequency. Such laser having tunable frequency offers the possibility of modifying the time interval between pulses.

Referring to FIG. 3, the method for thermally processing a substrate 4 with a pulsed light beam 13 comprises a phase a) of determining a value of a parameter relative to pulsed light beam 13. The parameter relative to pulsed light beam is selected from a group comprising: the duration of the time interval Δt between two pulses 25, 27, the energy density Ed of the pulses 25, 27, the scan speed of the pulsed light beam over surface region 5, the pulsed light beam shape, the pulse duration $t_p$, the number of pulses 25, 27.

The amount of energy delivered by each pulse 25, 27 is less than an amount of energy necessary for the surface region 5 to reach the melt temperature Tm of surface region 5.

The values of the parameter relative to pulsed light beam 13 are determined based on at least one thermal processing parameter. The thermal processing parameter is selected from a group comprising: a target surface temperature, the predetermined preliminary surface temperature, the predetermined subsequent surface temperature $T_{27}$, a predetermined temperature ramp, a time at and/or above a predetermined temperature, a predetermined temperature-depth profile 8 of substrate 4, a predetermined depth.

The predetermined depth is a depth below which the temperature of the substrate 4 should not exceed a given temperature, in order not to damage devices buried deeper in substrate 4. The given temperature is, for example, 400° C.

FIG. 4 is a graph of the variation of temperature of region 3 in function of time during a thermal process.

FIG. 4 represents a second temperature curve 37 corresponding to the variation of surface temperature of surface region 5. FIG. 4 represents a third temperature curve 39 corresponding to the variation of another temperature of buried layer 41 situated at a depth $D_{41}$ within substrate 4. Here the depth $D_{41}$ of the layer is for example about 1 micrometer.

At the beginning of the thermal processing, substrate 4 has an initial temperature-depth profile and the surface temperature Ts of surface region 5 is at an initial surface temperature T0. For example, substrate 4 is at room temperature.

During a step b), a preliminary pulse 25 of pulsed light beam 13 illuminates surface region 5. Preliminary pulse 25 thereby provides a preliminary amount of energy $E_{25}$ to surface region 5, heat is locally generated by surface region 5 and surface temperature Ts reaches a predetermined preliminary surface temperature $T_{25}$. The local heating, also called thermalization phase, happens faster than $1 \times 10^{-10}$ seconds.

During this "on state" of pulsed light beam 13, surface temperature Ts increases and reaches predetermined preliminary surface temperature $T_{25}$, for example about 240° C.

Pulsed light beam 13 is then in the "off state". During the "off state", which corresponds to the time interval Δt between two pulses, the surface region 5 is not illuminated by pulsed light beam 13. As a consequence, surface temperature Ts decreases and reaches predetermined intermediate surface temperature Ti.

The duration of time interval Δt was determined in step a) such that surface region 5 only partially relaxes. Surface region 5 relaxes proportionally to time interval Δt. In other words, surface temperature Ts does not go back to initial value T0. In other words, predetermined intermediate surface temperature Ti is greater than initial value T0.

Furthermore, during time interval Δt, the other temperature of buried layer 37 increases as the heat generated by surface region 5 diffuses into buried region 6. During step a), the values of the parameters relative to pulsed light beam 13 were determined so that the preliminary amount of heat generated diffuses down to the predetermined depth of diffusion, and to obtain a predetermined temperature-depth profile of substrate 4.

During a step c), subsequent pulse 27 illuminates surface region 5 after time interval Δt. Subsequent pulse 27 thereby provides a subsequent amount of energy $E_{27}$ to surface region 5. Surface region 5 generates a subsequent amount of heat and surface temperature Ts reaches a predetermined subsequent surface temperature $T_{27}$. A cumulative effect is then observed: since predetermined intermediate surface temperature $T_i$ is greater than initial surface temperature $T_0$, then predetermined subsequent surface temperature $T_{27}$ is greater than predetermined preliminary surface temperature $T_{25}$. In this example, all the pulses 25, 27 provide the same amount of energy.

Step b) of illuminating surface region 5 with preliminary pulse 25 and step c) of illuminating surface region 5 with subsequent pulse 27 are repeated until surface temperature Ts of surface region 5 reaches a target surface temperature and substrate temperature reaches a target temperature-depth profile.

Optionally, if the surface region 5 to be thermally processed is larger than light spot 20, pulsed light beam 13 is scanned over surface region 5 during a step d). In this case, a first part of surface region 5 is illuminated by preliminary pulse 25 and a second part of surface region 5 is illuminated by subsequent pulse 27.

In FIG. 4, 41 cycles corresponding to 41 pulses are observed. It is visible that surface temperature Ts presents a cyclical variation where the surface temperature varies rapidly between surface temperature maxima reached during the "on state", corresponding to preliminary and subsequent temperatures, and surface temperature minima reached during the "off state".

On the contrary, third temperature curve 39 of buried layer 41 has a smooth profile. Buried layer 41 is not subject to a cyclical variation of temperature.

FIGS. 5a and 5b illustrate an example of structure that can be processed with the thermal processing of the invention.

FIGS. 5a and 5b illustrate a silicon FINFET structure 43. The fins 45 are separated by a distance d, for example equal to 50 nanometers.

In FIG. 5a, pulsed laser beam 13 is in an "on state", a pulse of pulsed light beam 13 illuminates surface region 5.

Pulsed light beam 13 is not strictly confined to region surface 5. Pulsed light beam 13 penetrates a few nanometers, into FINFET structure 43. For example, for an ultraviolet laser, a pulsed light beam penetrates 1 nanometer into Germanium material, 3 nanometers into Silicon-Germanium material, and 7 nanometers into Silicon material. For example, for an ultraviolet laser, a pulsed light beam penetrates up to 10 nanometers for common semiconductors. For example, for an ultraviolet laser, a pulsed light beam penetrates up to 200 nanometers into metals and other wide gap materials such as silicone carbide (SiC) or gallium nitride (GaN).

FINFET structure 43 receives an amount of energy from the pulse and a plurality of areas 47 of FINFET structure 43 undergo local heating (thermalization).

In FIG. 5b, pulsed laser beam 13 is in an "off state", surface region 5 is not illuminated. The heat diffuses within FINFET structure 43 beyond areas 47. Arrows 49 indicated the direction of the heat diffusion.

FIG. 6 is a graph of temperature variation at various depths of FINFET structure 43.

In this example, the temperature of the silicon surface region 5 of FINFET structure 43 should undergo a gradual anneal up to or above a target temperature equal to the melt temperature, here 1415° C. Substrate 4 has a buried layer at a depth of 10 micrometers below surface region 5, which, to avoid damages, should not be annealed above 500° C.

Values of parameters relative to pulsed light beam 13 are determined to comply with the aforementioned thermal requirements. It was determined that the following values of the parameters satisfied the temperature requirements:
  pulse duration=0.9 nanoseconds;
  Time interval=10 nanoseconds,
  repetition rate=100 MegaHerz
  energy per pulse=10 millijoule/centimeter squared
  peak temperature=272.98° C.

After submitting substrate 4 to the thermal processing, the surface temperature is greater than 1420° C., in other words greater than the melt temperature. The time at temperature is 7.4 microseconds.

In FIG. 6, a fourth temperature curve 51 corresponds to a higher envelope part and a fifth temperature curve 53 corresponds to a lower envelope part of the surface temperature. After 5 microseconds of thermal processing, the fourth temperature curve 51 has reached the target temperature.

A sixth temperature curve 55 corresponds to the temperature variation of a layer at 1 micrometer depth. A seventh temperature curve 57 corresponds to the temperature variation of a layer at 2 micrometers depth. An eighth temperature curve 59 corresponds to the temperature variation of a layer at 5 micrometers depth. A ninth temperature 61 curve corresponds to the temperature variation of a layer at 10 micrometers depth.

In FIG. 6, it is visible that the temperature decreases with depth.

It is also visible that after 5 microseconds of thermal processing the temperature of the layer buried at 10 micrometer depth reaches about 420° C., which is below the desired 500° C.

FIG. 7 illustrates different surface temperature dynamics obtained with different value of the parameters relative to pulsed light beam 13.

A tenth temperature curve 63 is obtained by illuminating surface region 3 with tenth pulse train 65. Tenth temperature curve 63 corresponds to a long thermal processing with smooth temperature ramp and relatively uniform in depth.

The thermal processing achieved with tenth pulse train 65 is similar to a classical equilibrium annealing, also known as millisecond rapid thermal annealing (RTP).

Eleventh temperature curve 67 is obtained by illuminating surface region 3 with eleventh pulse train 69. The pulses of eleventh pulse train 69 provide higher energy to surface region 5 compared to the pulses of tenth pulse train 65. The thermal processing achieved with eleventh pulse train 69 is similar to a classical step and repeat nanosecond process.

Twelfth temperature curve 71 is obtained by illuminating surface region 5 with twelfth pulse train 73. The thermal processing achieved with twelfth pulse train 73 is an intermediate solution with important selectivity and high peak temperature, but this thermal processing has a temperature ramp less steep than the temperature ramp of a classical pulsed laser processing, and thus is less aggressive and has less risk of causing damage to the devices on surface region 5 and to the devices buried in substrate 4.

FIGS. 8a, 8b, 8c illustrate additional capabilities of controlling surface envelop by controlling the energy delivered by each pulse of a pulse train.

FIG. 8a illustrates a thirteenth temperature curve 75 that exhibits a standard surface temperature ramp up. In this example, Surface region 5 is submitted to a thirteenth pulse train 77 having pulses of equal energy and uncontrolled cooling at the end of the pulse train.

Figure 1:
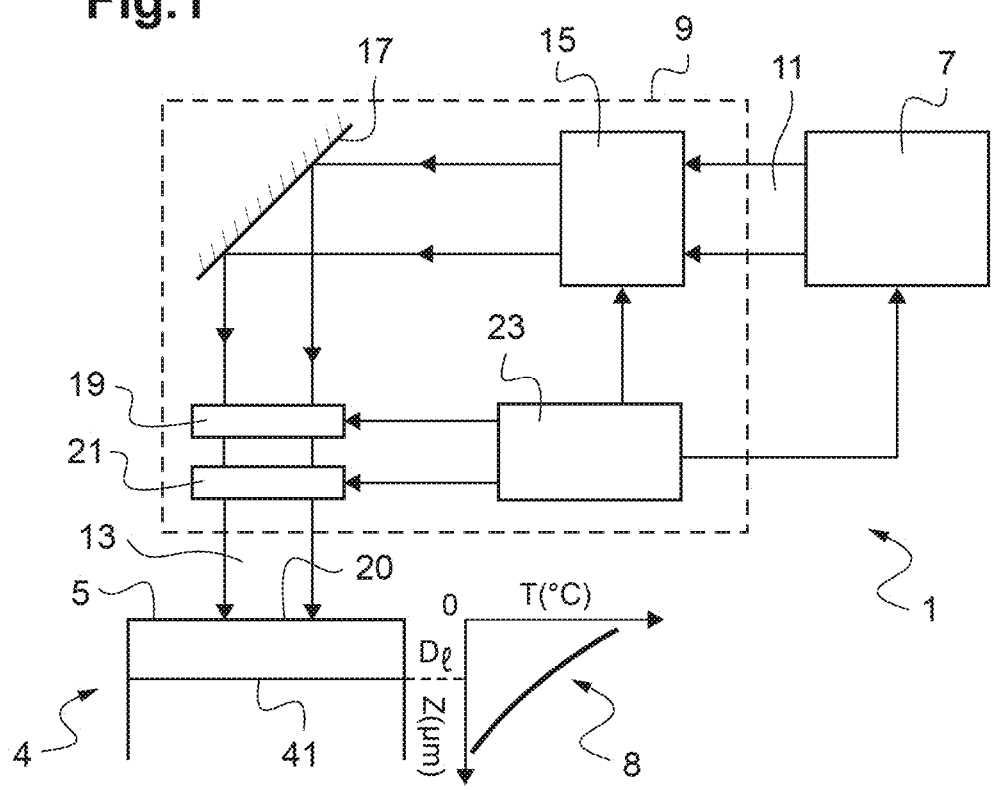
Figure 2:
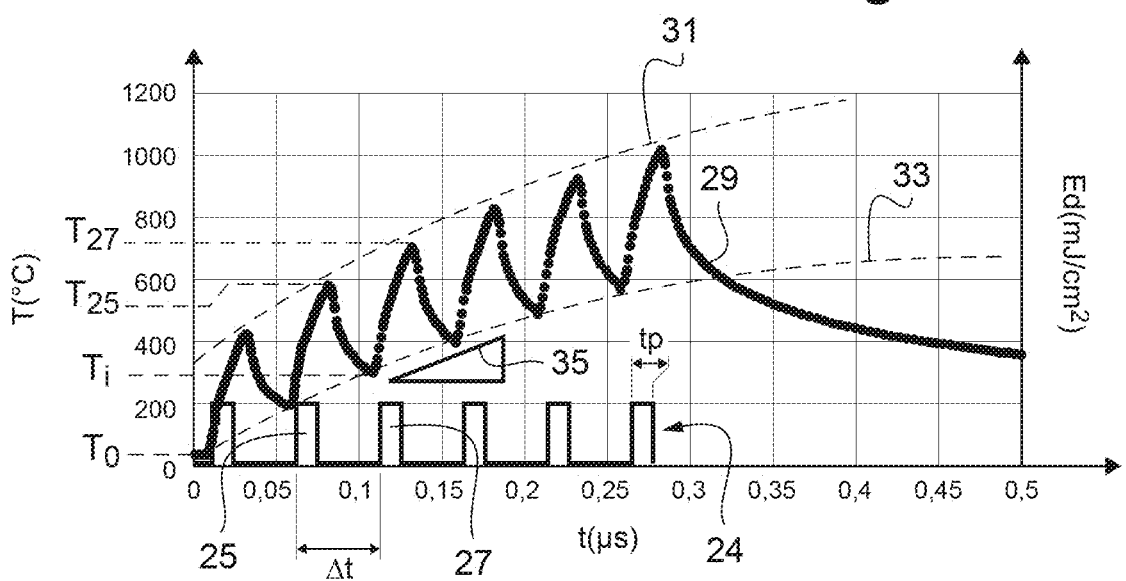
Figure 6:
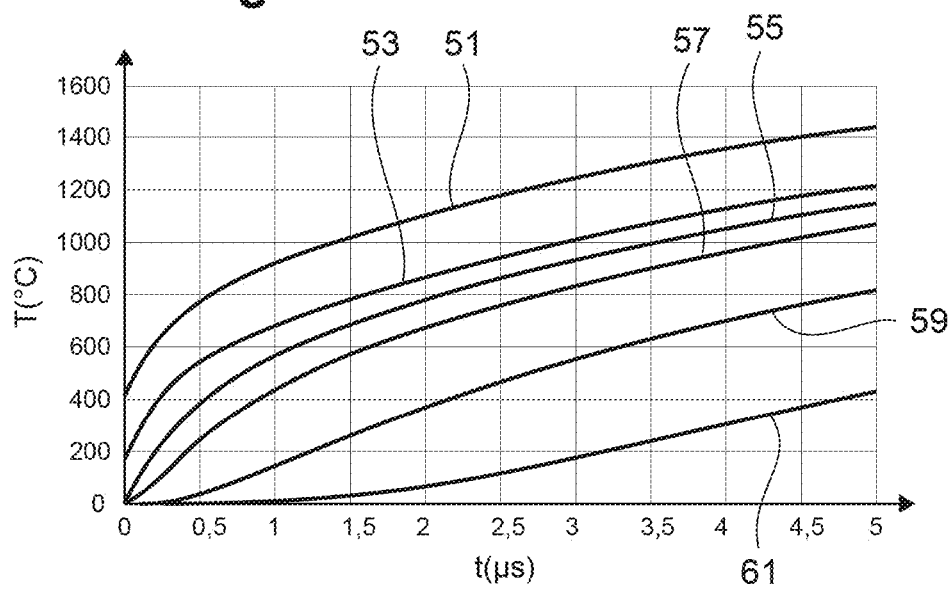
Figure 7:
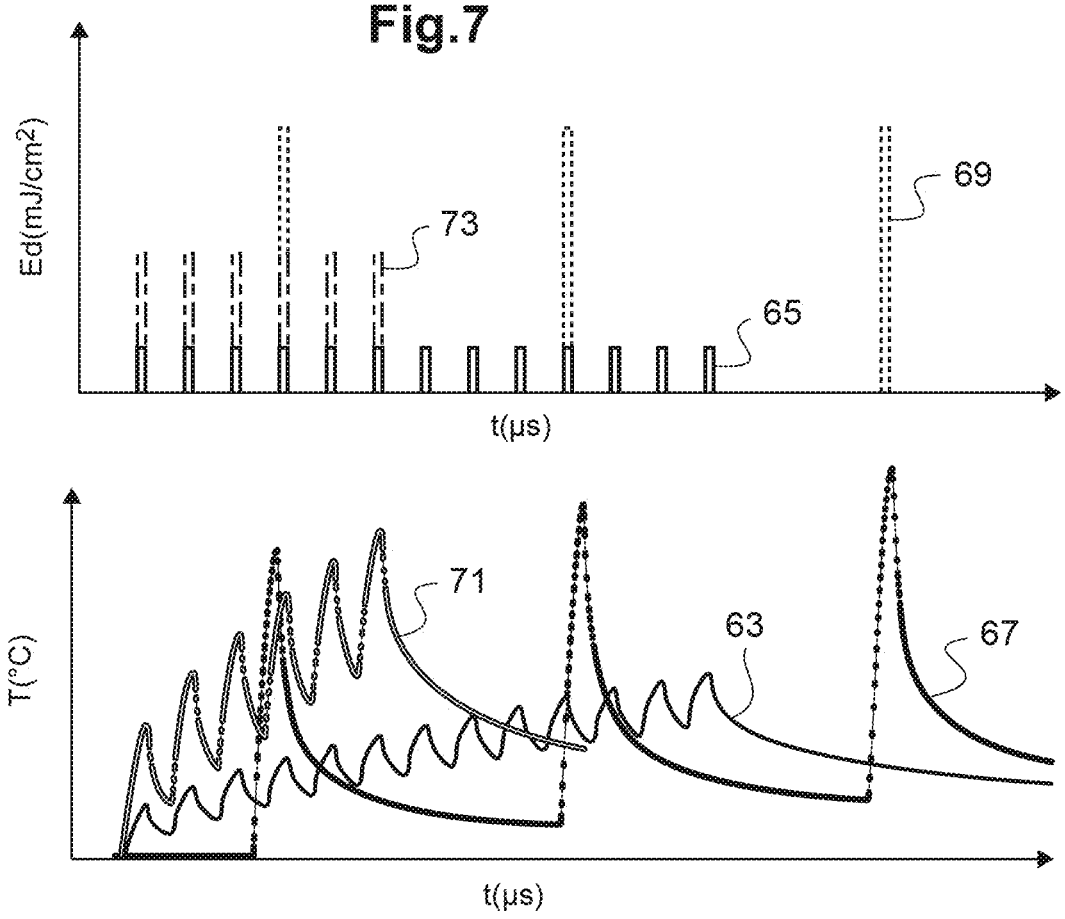
Figure 8A:
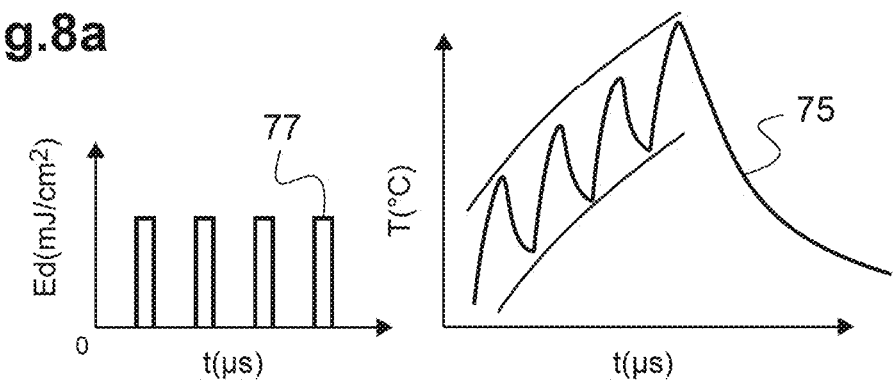
FIG. 8b illustrates a fourteenth temperature curve 79 that exhibits a standard temperature ramp up followed by the stabilization of the envelope at a given temperature obtained by a correspondent decrease in the energy per pulse of a fourteenth pulse train 81.
FIG. 8c illustrates a fifteenth temperature curve 83 that exhibits a standard temperature ramp up followed by a controlled cooling obtained by progressively reducing the energy provided by each pulse of a fifteenth pulse train 85.
Figure 8B:
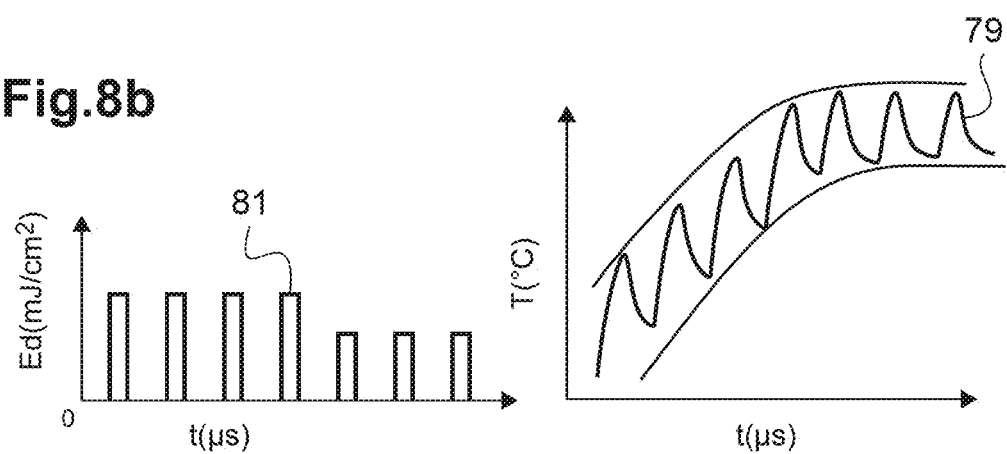
Figure 8C:
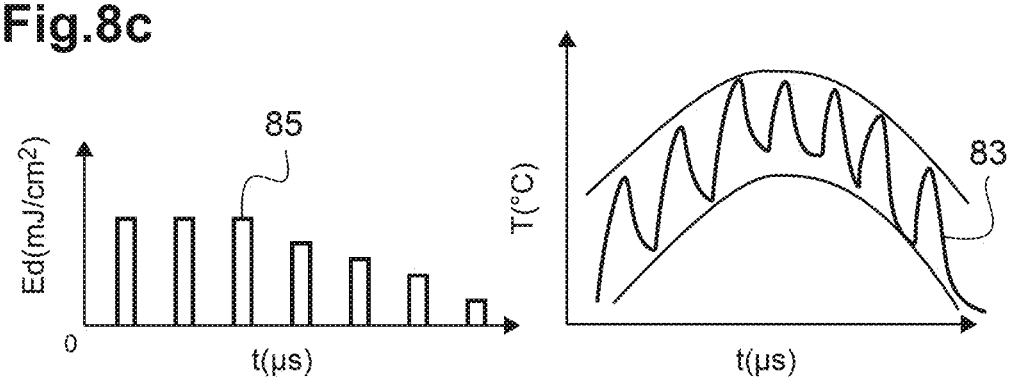

According to another example, other combination of parameters relative to pulsed light beam 13 are available, for example it is possible to vary both the time interval Δt and the energy delivered by each pulse during the thermal processing.

According to another example, the method can be applied to substrate 4 whose buried region comprises a region 87 implanted with dopant elements having a predetermined dopant elements concentration-depth profile. In this case, step b) of illuminating surface region 5 with a preliminary pulse 25 and step c) of illuminating surface region 5 with a subsequent pulse 27 are repeated until the substrate temperature presents a target temperature-depth profile. The target temperature-depth profile is adapted to activate the dopants elements of the implanted region 87.

For example, the method can be applied to the formation of deep junction device, for example Silicon Insulated Gate Bipolar Transistor (IGBT).

To manufacture a Silicon IGBT device, dopant elements are implanted into a Silicon substrate by bombarding a surface region of a Silicon substrate, here a back surface, with dopant elements. For example, an implanted region of the substrate can have a dopant elements concentration greater than $1 \times 10^{13}$ atoms per centimeter squared.

The dopant elements modify the electrical property of the substrate by generating unipolar carriers. Dopant elements of the acceptor type generate positive unipolar carriers. Dopant elements of the donor type generate negative unipolar carriers.

Figure 9:
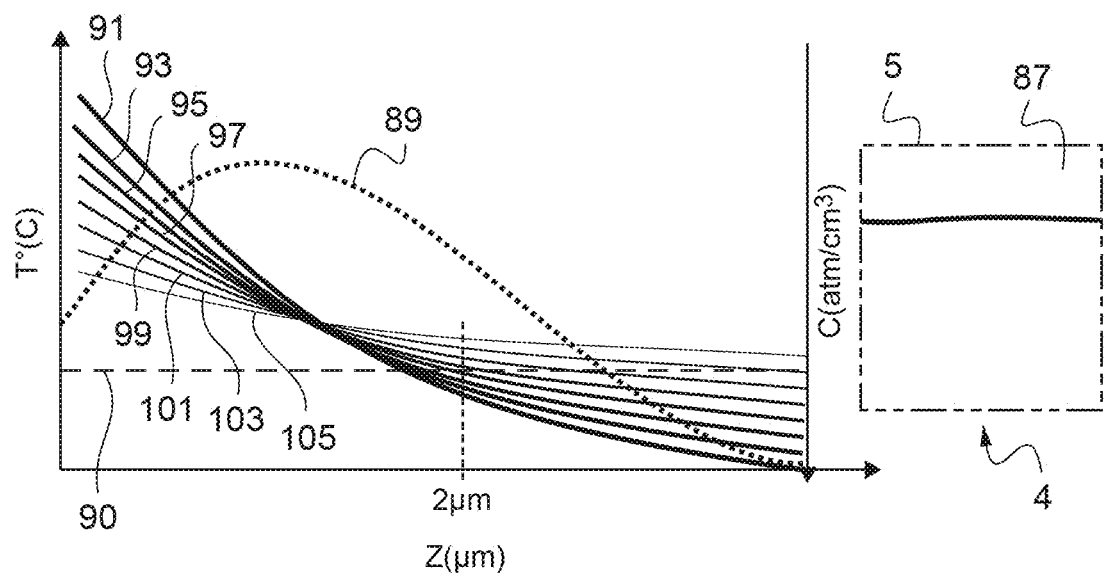

FIG. 9 represents a substrate 4 that comprises an implanted region 87. In this example, implanted region 87 is implanted with a single dopant specie, here phosphorus (Ph). Phosphorous dopant elements are adapted to generate one type of unipolar carriers.

FIG. 9 represents a predetermined implantation profile of phosphorus 89 in substrate 4 as a function of the substrate depth, in other words a predetermined dopant elements concentration-depth profile 89 of the substrate 4.

An implantation energy comprised between 700 keV and 2 MeV is used to obtain a deep implantation profile reaching between 1 micrometer to 5 micrometers in depth.

Implanted region 87 is, for example, situated in the buried region of the substrate, at a depth deeper than 500 nanometers from surface region 5. Implanted region 87 has, for example, a thickness equal to or lower than 500 nanometers.

In this example, to activate the phosphorous dopants implanted at a depth down to 2 micrometers, the temperature of implanted region 87 down to 2 micrometers should be greater than or equal to an activation temperature Ta. Activation temperature Ta is, for example, greater than or equal to 700° C. However, the temperature of the face opposite the implantation face of substrate 4 cannot be heated at a temperature above 400° C. in order to avoid damage. Preferably, the opposite face should not be heated at a temperature above 100° C.

In FIG. 9, the activation temperature Ta is represented by a horizontal dotted line 90. Regions of the substrate 4 having a temperature above the activation temperature Ta are activated. Regions of the substrate 4 having a temperature below the activation temperature Ta are not activated.

FIG. 9 also displays a series of temperature-depth profiles 91, 93, 95, 97, 99, 101, 103, 105 of the substrate 4. Each of the temperature-depth profiles 91-105 is obtained when submitting substrate 4 to the method of the invention. Each of the temperature-depth profiles 91-105 corresponds to a different combination of the values of the parameters relative to the pulsed light beam. In this example, each temperature-depth profiles 91-105 is obtained with a different combination of energy density and of number of pulses.

For example, temperature-depth profile 91 corresponds to a sequence of pulses having higher energy density and a lower number of pulses than the other temperature-depth profiles 93-105. It is visible that compared with the other temperature-depth profiles 93-105 the temperature of substrate 4 is higher at shallow depths and decreases faster to a temperature lower than the other temperature-depth profiles 93-105 at deeper depths.

When surface region 5 is submitted to a sequence of pulses with high energy density and low pulse number, the heat generated is constrained near the surface region, that is why the temperature of the substrate near the surface region 5 is high and the temperature of the substrate near at deeper depth is low.

Temperature-depth profile 105 corresponds to a sequence of pulses having lower energy density and a higher number of pulses than the other temperature-depth profiles 91-103. It is visible that, compared with the other temperature-depth profiles 91-103, the variation of temperature near the surface and at the deepest depth is small.

When surface region 5 is submitted to a sequence of pulses with low energy density and high pulse number, the heat dissipates deeper into the substrate that is why the temperature of the substrate near the surface region 5 and the temperature of the substrate at the deepest depth are close.

The temperature-depth profiles 93-103 between the steepest temperature-depth profile 91 and the flattest temperature depth profile 103 correspond to other different combinations of the values of the parameters relative to the pulsed light beam, wherein the steeper profiles have a higher energy density and a lower pulse number than the flatter profiles.

From FIG. 9, it is visible that not every temperature-depth profile is adapted to activate dopant elements situated at a depth down to 2 micrometers. Here, only temperature-depth profiles 99-105 are adapted since the temperature of the substrate at 2 micrometers depth is above the activation temperature Ta. Hence the target temperature-depth profile adapted to activate the phosphorous dopant element may be selected from any of the temperature-depth profiles 99-105.

One of the temperature-depth profiles 99-105 is obtained, for example, by illuminating the surface region with 500 pulses of less than 1 nanosecond, each pulse having an energy density of 19 millijoule per centimeter squared and a time interval Δt of 12 nanoseconds.

Another of the temperature-depth profiles 99-105 is obtained, for example, by illuminating the surface region with 1000 pulses of less than 1 nanosecond, each pulses having an energy density of 15 millijoule per centimeter squared and a time interval Δt of 12 nanoseconds. In this second energy profile example, a deeper affect is visible as the diffusion time is increased.

Figure 10:
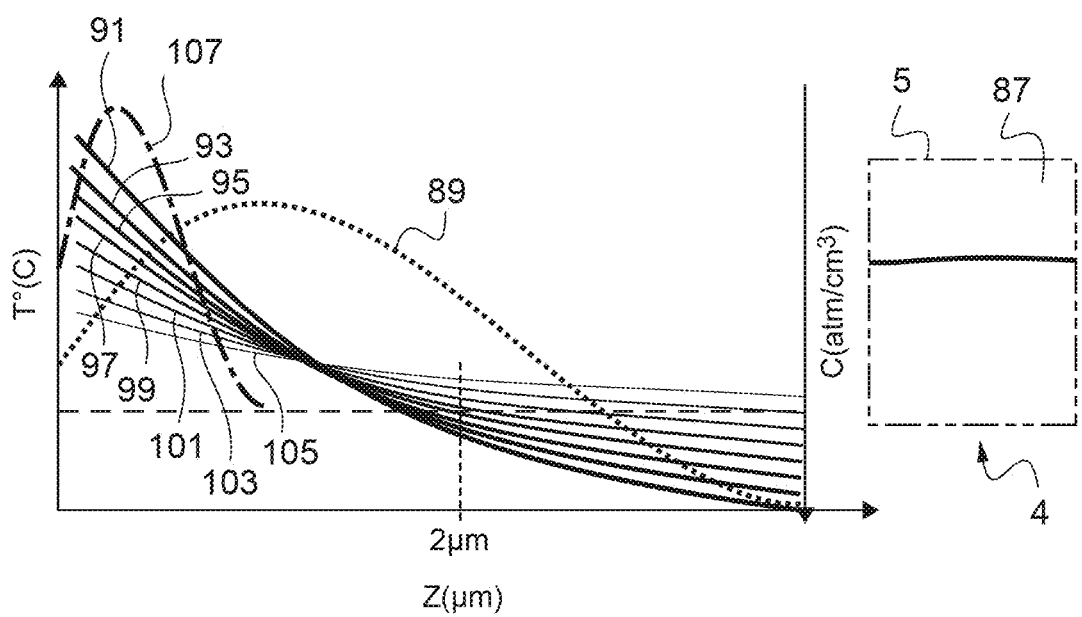

FIG. 10 illustrates another example where a substrate 4 is implanted with two types of dopant elements. Here the two types of dopant elements comprise Phosphorous and Boron. In a silicon substrate, the Boron dopant elements act as acceptors. In other word, Boron dopant elements are adapted to generate another type of unipolar carriers, more precisely holes.

Hence, in this example, the substrate is implanted with dopants elements adapted to generate two types of unipolar carriers.

The phosphorous atoms are, for example, implanted as in the previous example. The Boron atoms are, for example, implanted with an energy comprised between 1 and 100 kiloelectronvolt.

FIG. 10 illustrates the same curves as FIG. 9. In addition, FIG. 10 also illustrates an implantation profile of boron (107) in substrate 4 as a function of the substrate depth, in other words another dopant element concentration-depth profile 107 of the substrate 4.

The different temperature-depth profiles 91-105 can be used to select a target temperature-depth profile and hence the combination of energy density and number of pulse to activate the dopant elements implanted in substrate 4.

The method can be applied for substrate made of a semiconductor material selected from a group comprising: Silicon Carbide, Silicon Germanium, Germanium, Gallium Nitride, Gallium Arsenide, Diamond.

Dopant elements are selected, depending on the application, among a group comprising: boron, phosphorus, arsenic, aluminum, gallium, indium, thallium, antimony and bismuth.

The invention claimed is:

1. A method for thermally processing a substrate with a pulsed light beam, the substrate having a surface region and a buried region, a substrate temperature of the substrate presenting an initial temperature-depth profile and a surface temperature of the surface region being at an initial surface temperature, the method comprising:
    illuminating the surface region with a preliminary pulse of the pulsed light beam, the preliminary pulse thereby providing a preliminary amount of energy to the surface region, so that the surface region generates a preliminary amount of heat and the surface temperature reaches a predetermined preliminary surface temperature; and
    illuminating the surface region of the substrate with a subsequent pulse of the pulsed light beam after a time interval, the subsequent pulse thereby providing a subsequent amount of energy to the surface region so that the surface region generates a subsequent amount of heat and the surface temperature reaches a predetermined subsequent surface temperature, the time interval being determined such that during the time interval the surface temperature reaches a predetermined intermediate surface temperature, said predetermined intermediate surface temperature being greater than the initial surface temperature, such that
        during said time interval, said preliminary amount of heat is diffused in the buried region down to a predetermined depth of the substrate so that the substrate temperature presents a predetermined intermediate temperature-depth profile, a combination of values of an energy density and a number of pulses relative to the pulsed light beam being determined in order to obtain the predetermined intermediate temperature-depth profile.

2. The method according to claim 1, wherein the illuminating the surface region with the preliminary pulse and the illuminating the surface region with the subsequent pulse are repeated until the surface temperature reaches a target surface temperature and the substrate temperature presents a target temperature-depth profile.

3. The method according to claim 2, wherein the buried region of the substrate comprises a region implanted with dopant elements having a predetermined dopant elements concentration-depth profile, and
    wherein the target temperature-depth profile activates the dopant elements of the implanted region.

4. The method according to claim 3, wherein the implanted region is situated at a depth greater than 500 nanometers from surface region and has a thickness less than 50 micrometers.

5. The method according to claim 3, wherein the dopant elements are configured to generate one type of unipolar carriers in the implanted region.

6. The method according to claim 3, wherein the dopant elements are configured to generate two types of unipolar carriers in the implanted region.

7. The method according to claim 1, wherein the substrate is a semiconductor material selected from the group consisting of silicon carbide, silicon germanium, germanium, gallium nitride, gallium arsenide, and diamond.

8. The method according to claim 2, wherein the target temperature is the melt temperature of the surface region.

9. The method according to claim 1, wherein the values are determined in order to reach the predetermined preliminary surface temperature, the predetermined intermediate surface temperature, and a predetermined subsequent temperature-depth profile,
    wherein the values further include one or more of the time interval and a shape of a light spot formed by the pulsed light beam on the surface region.

10. The method according to claim 9, further comprising scanning the pulsed light beam over the surface region,
    wherein the values further include a scan speed of the pulsed light beam.

11. The method according to claim 1, wherein the preliminary amount of energy delivered by the preliminary pulse is different from the subsequent amount of energy delivered by the subsequent pulse.

12. The method according to claim 1, wherein the amount of energy delivered by each of the preliminary pulse and subsequent pulse is less than an amount of energy necessary for the surface region to reach a melt temperature of the surface region of the substrate.

13. The method according to claim 1, wherein each of the preliminary pulse and subsequent pulse has a duration equal to or less than 1 nanosecond.

14. The method according to claim 1, wherein the time interval between the preliminary pulse and the subsequent pulse is equal to or less than 25 nanoseconds.

15. The method according to claim 1, wherein the pulsed light beam has a wavelength equal to or less than 532 nanometers.

16. The method according to claim 1, wherein the energy density of the pulsed light beam is greater than 1 millijoule per centimeter squared.

17. A system for thermally processing a substrate with a pulsed light beam, the substrate having a surface region and a buried region, a substrate temperature of the substrate presenting an initial temperature-depth profile and a surface temperature of the surface region being at an initial surface temperature, said system comprising:
a light source configured to emit a light beam; and
a beam control system configured to generate the pulsed light beam from the emitted light beam, said beam control system being configured to generate a preliminary pulse and a subsequent pulse,
said preliminary pulse of the pulsed light beam illuminating the surface region of the substrate, the preliminary pulse thereby providing a preliminary amount of energy to said surface region, so that the surface region generates a preliminary amount of heat and the surface temperature reaches a predetermined preliminary surface temperature,
said subsequent pulse of the pulsed light beam illuminating the surface region of the substrate after a time interval, the subsequent pulse thereby providing a subsequent amount of energy to said surface region, so that said surface region generates a subsequent amount of heat and the surface temperature reaches a predetermined subsequent surface temperature,
wherein said system is configured to generate said subsequent pulse after said time interval, said time interval being determined such that during the time interval the surface temperature reaches a predetermined intermediate surface temperature, said predetermined intermediate surface temperature being greater than the initial surface temperature, such that during the time interval, the preliminary amount of heat is diffused within the buried region down to a predetermined depth of the substrate so that the substrate temperature presents a predetermined intermediate temperature-depth profile, a combination of values of an energy density and a number of pulses relative to the pulsed light beam being determined in order to obtain the predetermined intermediate temperature-depth profile.

18. The system according to claim 17, wherein the system is configured to repeat the illumination of the surface region with the preliminary pulse and the illumination of the surface region with the subsequent pulse until the surface temperature reaches a target temperature and the substrate temperature presents a target temperature-depth profile.

19. The system according to claim 18, wherein the buried region of the substrate comprises a region implanted with dopant elements having a predetermined dopant element concentration-depth profile, and
wherein the target temperature-depth profile activates the dopant elements of the implanted region.

20. The system according to claim 17, wherein each of the preliminary pulse and subsequent pulse has a duration equal to or less than 1 nanosecond.

21. The system according to claim 17, wherein the pulsed light beam has a wavelength equal to or less than 532 nanometers.

22. The system, according to claim 17, wherein the time interval between the preliminary pulse and the subsequent pulse is equal to or less than 25 nanoseconds.

23. The system according to claim 17, wherein the energy density of the pulsed light beam is greater than 1 millijoule per centimeter squared.

24. The system according to claim 17, wherein the values are determined in order to reach the predetermined preliminary surface temperature, the predetermined intermediate surface temperature, and a predetermined subsequent temperature-depth profile,
wherein the values further include the time interval and a shape of a light spot formed by the pulsed light beam on the surface region.

* * * * *